Jan. 11, 1966 I. AMES 3,228,794

CIRCUIT FABRICATION

Filed Nov. 24, 1961 4 Sheets-Sheet 1

INVENTOR
IRVING AMES
BY Frederick D. Smyth
ATTORNEY

Jan. 11, 1966 I. AMES 3,228,794

CIRCUIT FABRICATION

Filed Nov. 24, 1961 4 Sheets-Sheet 4

United States Patent Office 3,228,794

Patented Jan. 11, 1966

3,228,794

CIRCUIT FABRICATION

Irving Ames, Peekskill, N.Y., assignor to International Business Machines Corporation, New York, N.Y., a corporation of New York Filed Nov. 24, 1961, Ser. No. 154,658
8 Claims. (Cl. 117—212)

This invention relates to circuit fabrication and more particularly to an improved method of fabricating multilayer thin film electrical circuits.

Recently, as a result of the increase in the complexity of large scale electrical systems, it has become necessary to reduce both the physical size and the power dissipated in the assembled components in order that the full advantages afforded by such large scale systems can be realized.

Of the several approaches taken to achieve these objectives, one of the most promising is microminiature components and circuits fabricated of solid state materials. These components and circuits are characterized by the desired reduction in physical size and power dissipation combined with controllable and reproducible electrical characteristics. The term solid state materials has been applied to a wide range of materials wherein the electrical characteristics are determined by the structure of the material itself. Well known examples of solid state materials are found in the fields of magnetics, semiconductors, superconductors, ferroelectrics and the like, and it is to components and devices fabricated of solid state materials to which this invention relates.

Further, microminiature electrical circuits formed, either wholly or in part, of solid state materials are advantageously fabricated in quantity by means of vacuum evaporation techniques. By these techniques, selected materials are successively heated to a temperature at which the material evaporates and is directed to and deposited upon a substrate in predetermined geometric configurations determined by selectively interposed pattern defining masks. In this manner, the various patterns and layers forming both the desired electrical components and devices, as well as complete electrical circuits, are fabricated.

A further reduction in both physical size and power dissipation is obtained by reducing the linear dimensions of the geometric patterns of the various layers. This reduction in dimensions, however, intensifies the registration problem in the fabrication of these devices as it is necessary that the active electrical portion of one layer be precisely physically oriented with respect to an active electrical portion of an adjacent layer. Various attempts have been made to obtain more precise registration of the deposited layers, generally by reducing the mechanical tolerances in the mechanisms which position the pattern mask for each layer adjacent the substrate and thereby obtaining registration limited only by the tolerances of the positioning mechanism. As an example of one such mechanism, reference may be had to the N. Theodoseau et al. Patent No. 3,023,727, issued on March 6, 1962 and assigned to the assignee of this invention. As there shown by way of example, means are provided for aligning a number of masks successively with an individual substrate, the complex aligning means affording a relatively high degree of registration.

According to this invention, there is provided a method of forming thin film solid state multilayer electrical components and devices, as well as circuits formed thereof, wherein a high degree of registration is obtained between the geometric patterns of the various layers without maintaining close mechanical tolerances in the positioning means for the several masks in order to more closely control the electrical characteristics of the completed assembly. Briefly, the invention provides a first pattern defining mask which determines a selected critical dimension of the multilayer assembly, and operates in conjunction with a number of auxiliary pattern defining masks. The first, or main, mask is rigidly secured during the entire fabrication operation, the auxiliary pattern defining masks being selectively interposed, as required, in the fabrication of the multilayer solid state device or circuit as more particularly hereinafter described.

It is an object of the invention, therefore, to provide an improved method of fabricating multilayer thin film electrical circuits.

Another object of the invention is to provide an improved method of fabricating solid state electrical devices.

Still another object of the invention is to provide an improved method of obtaining precise registration of the various active layers of a multilayer thin film electrical circuit element.

A related object of the invention is to provide an improvement in vacuum deposition techniques.

Yet another object of the invention is to provide an improved method of fabricating a superconductive switching device.

A further object of the invention is to provide an improved method of fabricating an in-line thin film cryotron.

The foregoing and other objects, features and advantages of the invention will be apparent from the following more particular description of a preferred embodiment of the invention, as illustrated in the accompanying drawings.

Figure 1A:
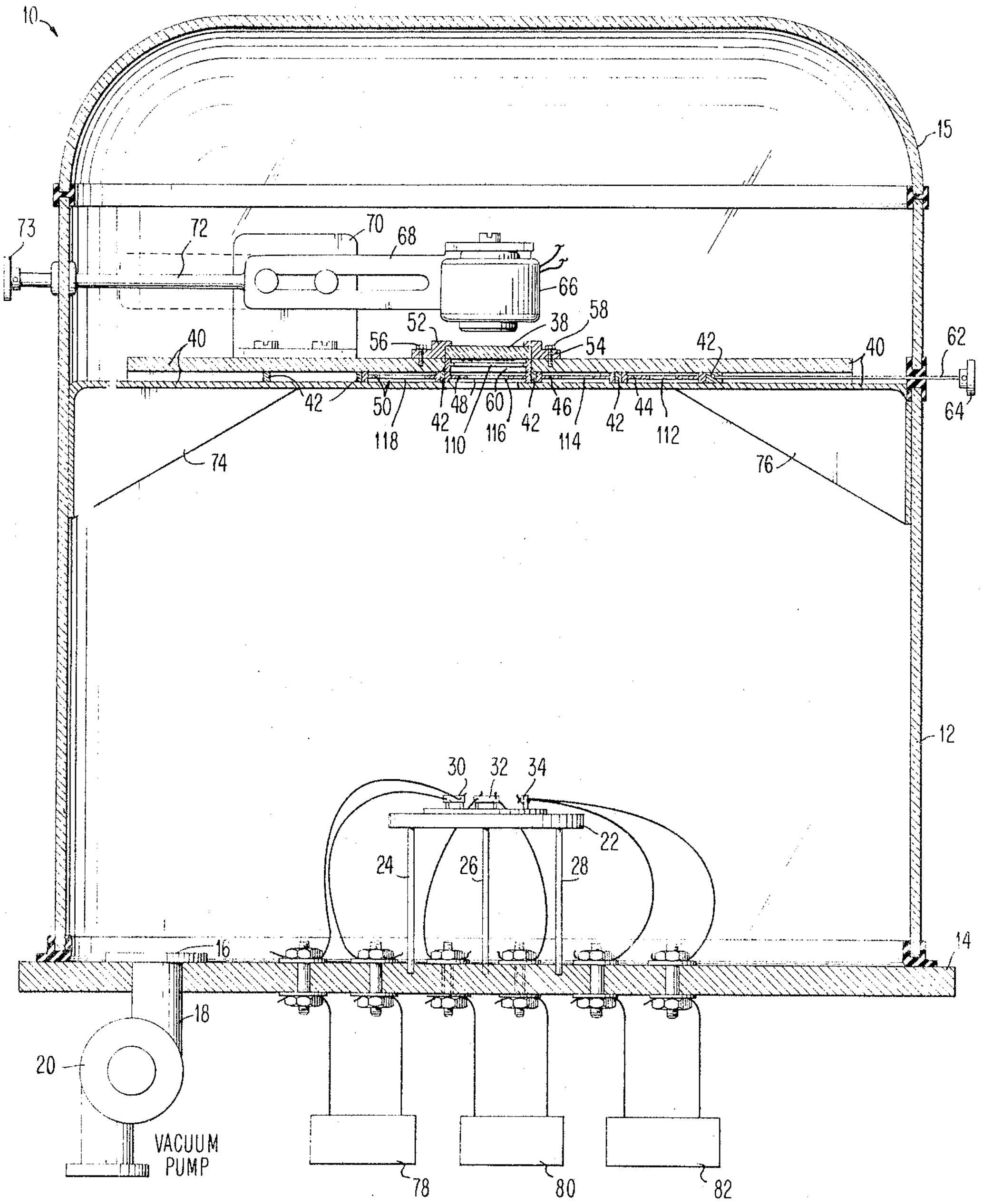
FIG. 1A illustrates an apparatus which may advantageously be employed in practicing the method of the invention.

Referring now to the drawings, FIG. 1A illustrates an apparatus that may advantageously be employed in practicing the method of the invention. As there shown, a vacuum chamber 10 consists of a bell jar 12 secured by conventional means to a base plate 14. In order to facilitate access to the upper portion of chamber 10, an upper sector 15 of bell bar 12 is selectively removable. An opening 16 is provided in base plate 14 through which a vacuum pump 20, connected to chamber 10 by means of a length of tubing 18, is selectively operable to reduce the pressure within the vacuum chamber to a predetermined level. As will be understood by those skilled in the art, pump 20 generally includes a combination of pumps capable of evacuating chamber 10 to a pressure of about $10^{-6}$ mm. Hg, such as by way of example, a rotary mechanical pump and an oil diffusion pump. Positioned within the lower portion of chamber 10 is a deck plate 22 spaced above base plate 14 by a number of rods 24, 26 and 28. Mounted upon deck plate 22 are a number of evaporation source structures 30, 32, 34. Also, within the upper portion of chamber 10, is positioned a substrate 38 upon which vaporized material from the evaporation sources is deposited as well as a mask support apparatus 40. Slideably engaged with mask support 40 is a mask holder 42 selectively operable to position one of a number of masks adjacent substrate 38. As shown in FIG. 1A, a number of masks 44, 46, 48 and 50 are positioned in holder 42 with the left most mask position thereof being empty as more particularly described hereinafter. Substrate 38 is rigidly secured to support 40 by means of a pair of brackets 52 and 54 and a pair of bolts 56 and 58, or, alternatively, by any other well konwn fastening means.

Figure 1B:
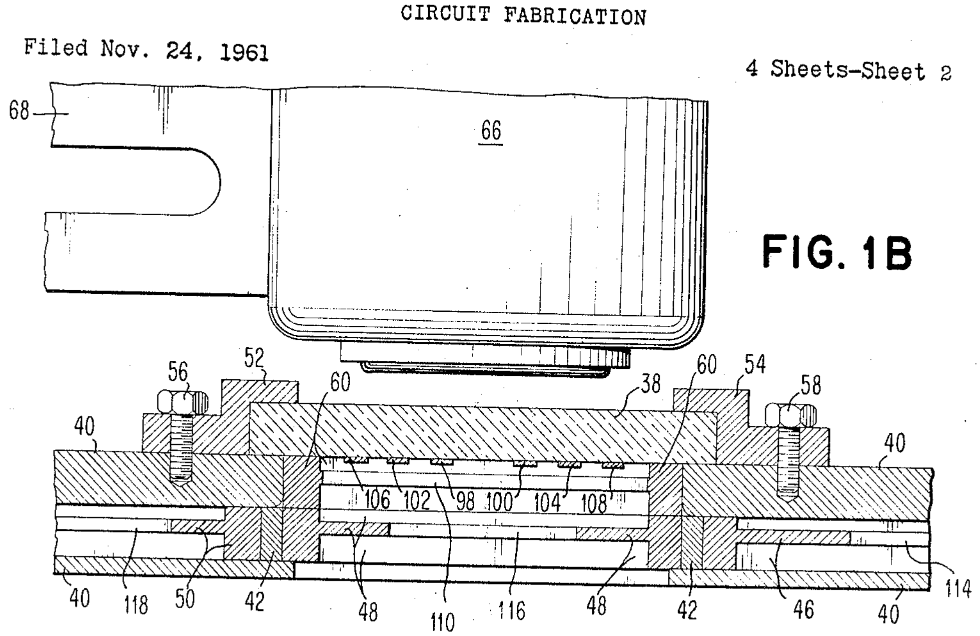
FIG. 1B is an enlarged view of a portion of the apparatus of FIG. 1A.

Referring now also to FIG. 1B, which is an enlarged detail view of the substrate mounting means shown in FIG. 1A, an additional mask 60, hereinafter referred to as the main mask, is positioned intermediate substrate 38 and mask 48. Mask holder 42, slideably engaged within support 40, is longitudinally positioned by means of a connecting rod 62 which extends without chamber 10 and terminates in a knob 64. With holder 42 slideably positioned at the extreme right hand position, mask 60, initially positioned in the extreme left recess of holder 42, is normally positioned beneath substrate 38 in the identical position as is mask 48 in both FIG. 1A and FIG. 1B. Thereafter, energization of a magnet 66 attracts mask 60, fabricated of a magnetic material, to the position shown in the figures and is rigidly maintained in this position during the fabrication operation, as more fully described in the detailed description to follow. Magnet 66 is secured to an arm 68 which is slideably mounted on a bracket 70. Longitudinal movement of arm 72, connected to arm 68 by means of a knob 73 positioned without chamber 10, removes the magnet from the position shown allowing access for the replacement of substrate 38.

Mask support 40 is supported by a pair of end brackets 74 and 76. Further, power for sources 30, 32 and 34 is supplied by individual electrical power sources 78, 80 and 82, respectively, indicated in block form in FIG. 1A and connected in conventional manner. It should be understood that the apparatus of FIG. 1A is merely illustrative of one of various apparatuses that may be employed in practicing the method of the invention as will be understood by those skilled in the art.

Although the method of the invention as indicated above is generally adaptable to the fabrication of mulitlayer solid state circuitry, the method will be described in detail in connection with the fabrication of an in-line cryotron. Briefly, a cryotron comprises a first, or gate, conductor the resistance of which is determined by the magnitude of current flow through a second, or control, conductor associated therewith, the current flow through the control conductor generating a magnetic field which is then applied to the gate conductor. The cryotron is normally operated at a temperature at which the gate conductor is superconducting in the absence of current flow through the control conductor, that is, the gate conductor exhibits the complete absence of electrical resistance. Thereafter, current flow through the control conductor, of at least a predetermined magnitude, generates a magnetic field which is sufficient at the operating temperature to quench super-conductivity in the gate conductor, the gate conductor then exhibiting normal electrical resistance. By the interconnection of various gate and control conductors of a number of cryotrons, amplifiers, oscillators, and logical circuits are constructed. For a more detailed understanding of cryotrons and logical circuits formed thereof, reference may be had to the volume entitled "Progress in Cryogenics," volume I, edited by K. Mendelssohn and published in 1959 by Academic Press, Inc., New York.

Originally, cryotrons were fabricated with a wire gate conductor around which was wound a single layer coil operable as a control conductor. From circuit considerations, as well as obtaining a reduction in physical size and an increase in operational speed, improved cryotrons have been fabricated of first and second planar thin films insulated one from another. Such cryotrons are disclosed in copending application Serial No. 625,512 filed November 30, 1956 on behalf of Richard L. Garwin and assigned to the assignee of this application. A particular class of the thin film cryotrons is commonly known as in-line cryotrons, that is, the gate and one or more control conductors are parallel one to another and extend longitudinally in the same direction. Additionally, the width of the gate and all of the control conductors are equal. This class of cryortons generally exhibit higher operation speeds than cross film cryortons wherein the control conductor is oriented at right angles to the gate conductor. Higher operation speeds result since, for a given control conductor inductance, it is possible to introduce an increased magnitude of resistance in the gate conductor. Normally, an in-line cryotron does not exhibit gain, which is generally defined as the ratio of the maximum current the gate conductor can carry, in the absence of current through any of the control conductors, before the gate current itself quenches superconductivity in the gate conductor to the critical control current, which is the minimum current flowing through the control conductor, in the absence of current flow through the gate conductor, necessary to quench superconductivity in the gate conductor. As will be understood from a reading of the "Progress in Cryogenics" reference, gain is necessary in cryotrons in order that a first cryotron can drive a second cryotron. However, through the application of a bias current through one of the control conductors of an in-line cryotron, it is possible to attain reasonable values of incremental gain. In the fabrication of complete electrical circuits employing a plurality of in-line cryotrons, it is necessary to insure that all of the control conductors of each cryotron are precisely aligned one to another and further are precisely aligned with the gate conductor to insure that all of the cryotrons have identical characteristics. Because the method of the invention readily provides precise alignment between all of the conductors of an in-line cryotron, the method is particularly adapted to the fabrication of such devices, as well as being adapted to the fabrication of other devices as briefly indicated hereinafter.

Figures 2A, 2B:
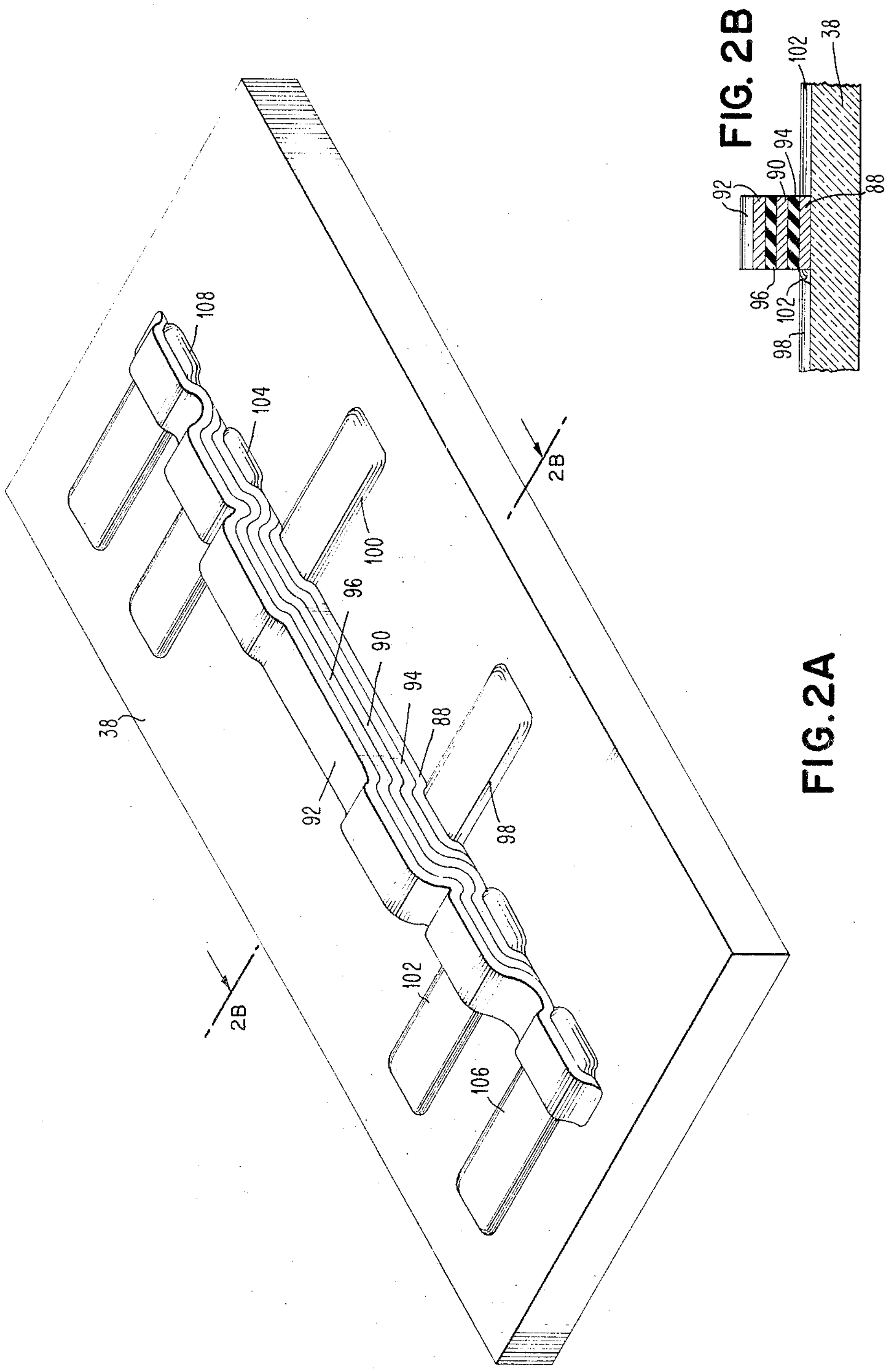
FIG. 2A is a diagrammatic view of an in-line cryotron fabricated according to the invention.
FIG. 2B is a cross sectional view of the cryotron of FIG. 2A.

Referring now to the drawings, there is shown in FIG. 2A an idealized pictorial representation of an in-line cryotron. As shown therein, an in-line cyotron includes a gate conductor 88 having superimposed thereon a pair of control conductors 90 and 92. Insulating layers 94 and 96 are provided to electrically isolate each of the conductors. Further, terminal connections are provided to each conductor as indicated by terminal pair 98 and 100 for gate conductor 88, terminal pair 102 and 104 for control conductor 90 and terminal pair 106 and 108 for control conductor 92. Finally, the cyrotron is supported upon substrate 38. FIG. 2B is an idealized cross sectional representation of the in-line cryotron taken along lines 2B—2B of FIG. 2A. As shown in FIG. 2B, each of the control conductors are precisely aligned vertically one to the other and further are in precise vertical alignment with gate conductor 88. As will be understood by those skilled in the art, a greater or lesser number of control conductors are employed as necessary. For reasons of clarity, however, the method of the invention will be described with reference to an in-line cryotron having a pair of control conductors, as shown in FIG. 2A.

Figure 3B:
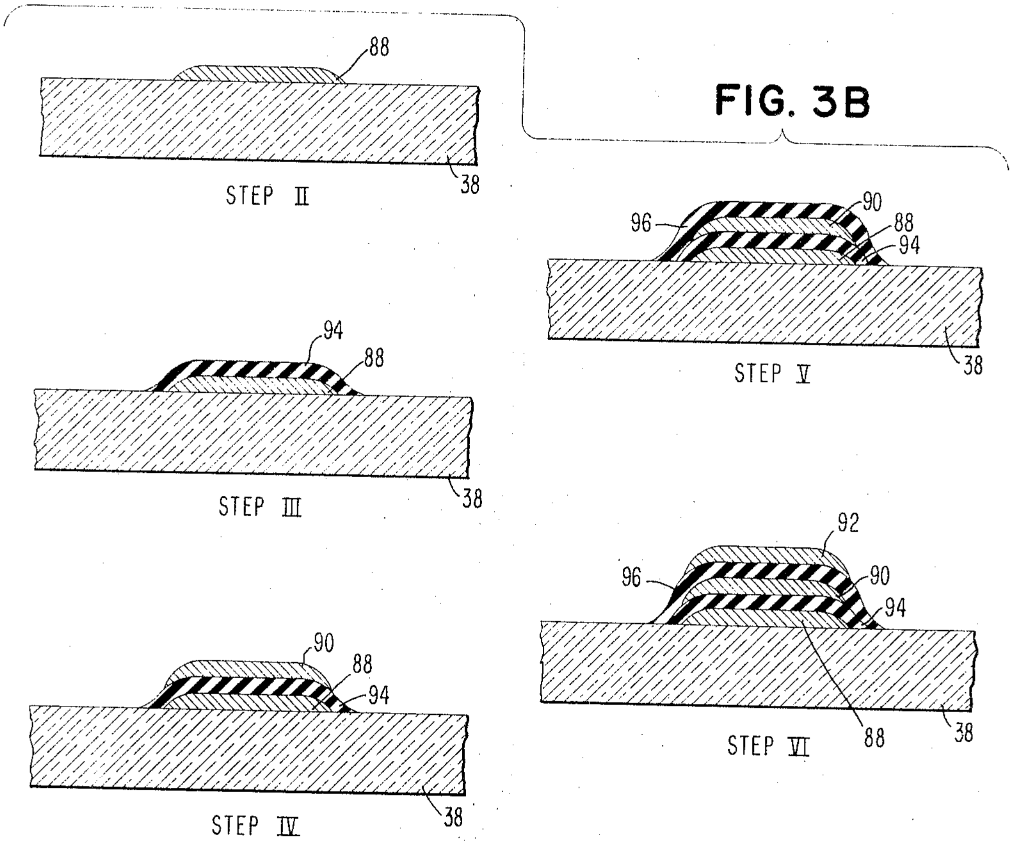
FIG. 3B is a cross sectional view of the deposited material in each of the steps of FIG. 3A.
Figure 3A:
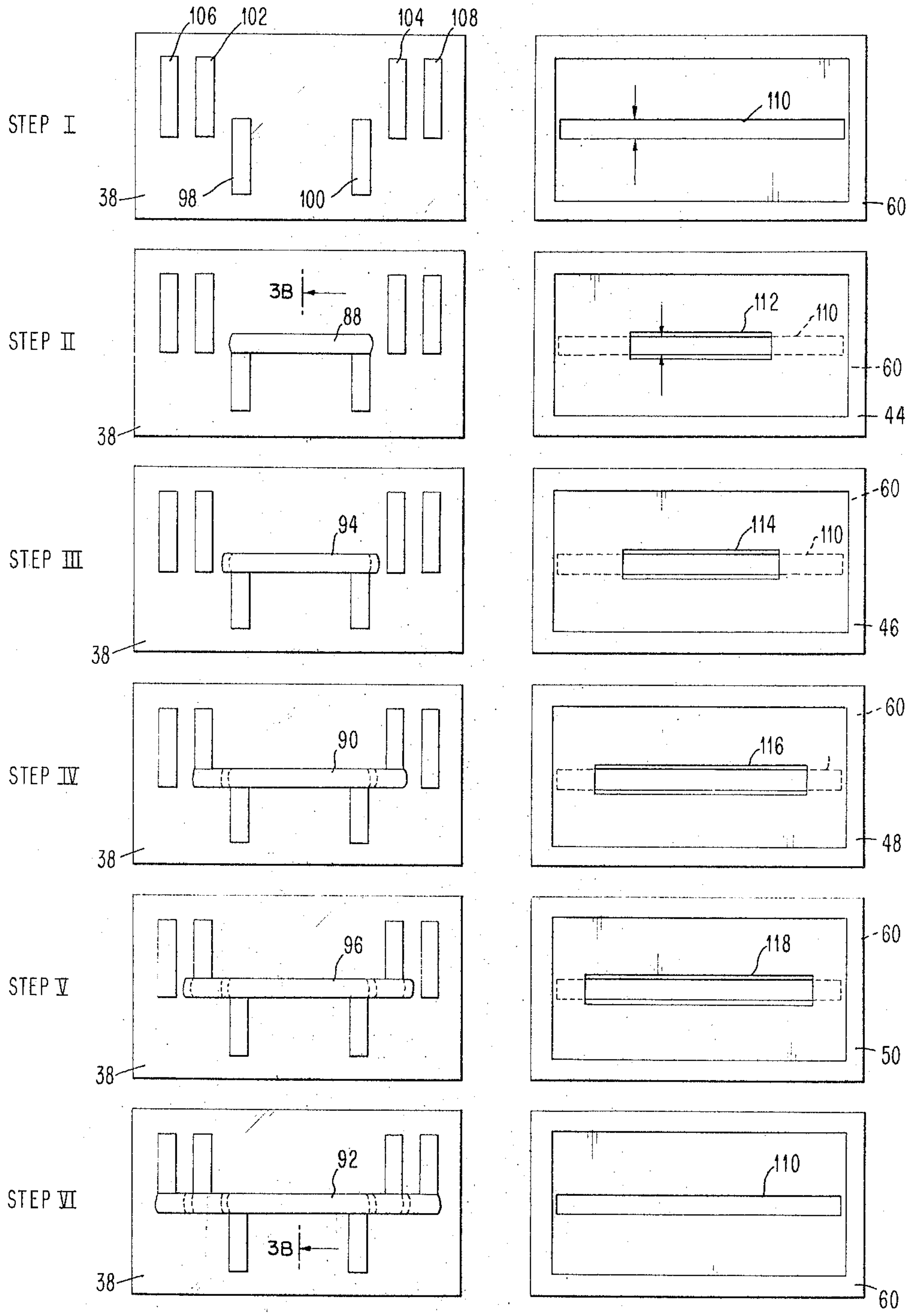
FIG. 3A illustrates the various steps in the fabrication of the cryotron of FIG. 2A together with the pattern masks employed in these steps.

The fabrication of the in-line cryotron illustrated in FIG. 2A is performed according to the invention in the following novel manner. Referring first to FIG. 1A, evaporant charges are placed in each of source structures 30, 32 and 34 as determined by the material selected for the gate conductor, control conductors and insulating layers. In the following example, tin is chosen for the gate conductor, lead for the control conductors and silicon monoxide for the insulating layers, it being understood that various other combinations of materials could be selected. Pattern masks 44, 46, 48, 50 and 60 are next loaded into mask holder 42 and substrate 38 is fastened to mask support 40. Chamber 10 is then vacuum sealed and pump 20 is operated to attain an evaporation pressure of about $10^{-6}$ mm. Hg. By means of knob 64 mask holder 42 is positioned in the extreme right hand position. In this position mask 60 is located in vertical alignment with substrate 38. Energization of magnet 66 at this time is effective to raise magnetic mask 60 from holder 42 adjacent to substrate 38 and this position (see FIG. 1B) is maintained throughout the entire evaporation procedure to be described so that mask 60 is solely effective to determine the width of each of the deposited layers. Referring now to FIG. 3A, STEP I therein is a detailed view of substrate 38 and mask 60. As shown, substrate 38 initially has preformed thereon gate terminal pair 98, 100 and control conductor terminal pairs 102, 104 and 106, 108. Mask 60 has an opening therein 110 having a length equal to the distance between the outer extremity of terminal pair 106, 108 and a width equal to W, which is the width of the gate and control conductors of the cryotron to be fabricated. At this time, STEP I of FIG. 3A, mask 60 is an intimate contact with substrate 38 as shown in FIG. 1B. Thus, at this time, opening 110 exposes a portion of each of the terminal pairs preformed on substrate 38. STEP II of FIG. 3A illustrates the manner in which the gate conductor is deposited. Holder 42 is operated to position mask 44 adjacent mask 60 as shown in STEP II of FIG. 3A. In this manner, mask 44, having an opening therein 112, is positioned adjacent mask 60. Opening 112 is selected to have a width greater than width W of opening 110 in mask 60 and a length determined by the distance between the outer edges of terminal pair 98, 100. In this manner, the combination of openings 110 and 112 are effective to determine the gate dimensions wherein the width is determined by mask 110 and the length thereof by opening 112. At this time, the tin containing evaporation source is operated for a time sufficient to deposit the required gate conductor thickness as shown as 88 in STEP II of FIG. 3A. Referring now to FIG. 3B, there is shown an idealized cross sectional view of the deposited material on substrate 38 with the steps indicated corresponding to the steps indicated in FIG. 3A. The cross sectional views of FIG. 3B are labeled "idealized" since, in order to emphasize the structure resulting from the method of the invention, the extraneous elements such as the terminal pairs and the height variations of the deposited layers passing over these terminal pairs is not shown for purposes of clarity, or, specifically, the cross sectional view is that taken through line 3B of FIG. 3A of essentially minute thickness.

STEP III of the process illustrated in FIG. 3A is effective to form insulating layer 94. This is accomplished by longitudinal motion of holder 42 to position mask 46 adjacent mask 60. Mask 46 has an opening 114, again having a width greater than W and a length greater than the length of opening 112 in mask 44 but less than the inner dimensions of terminal pair 102 and 104. At this time, the silicon monoxide containing source is operated to deposit layer 94 upon substrate 38. Referring now to STEP III in FIG. 3B, it should be noted that insulating layer 94 is indicated to have a width greater than that of the previously deposited gate 88 despite the fact that the width of each of these deposits is determined by opening 110 in mask 60. This result is obtained, which is necessary to insulate the various superimposed metallic layers one from another, by evaporating the silicon monoxide in a relatively poor vacuum at which noticeable scattering of the vaporized silicon monoxide occurs. This scattering occurs as a result of the interaction of the vaporized silicon monoxide with the gas molecules within chamber 10 thereby imparting random components of motion to the silicon monoxide beam and increasing the mask shadowing effect. Alternatively, to obtain this broadening of the deposited insulating layer, the diameter of the orifice of the silicon monoxide containing source is selected to be larger than that of the metal containing sources thereby obtaining a broader beam or by positioning the silicon monoxide evaporation source closer to mask 46.

Continuing, STEP IV of FIG. 3A indicates the fabrication of the first control conductor. Longitudinal movement of mask holder 42 is now effective to position mask 48 adjacent mask 60. Mask 48 has an opening 116 therein, again having a width greater than W and a length essentially equal to the distance between the outer ends of terminal pair 102 and 104. At this time, evaporation of lead is effective to form control 90 as shown. Referring to STEP IV of FIG. 3B, it is seen that control 90 has a width essentially equal to gate 88 and is effectively insulated therefrom by the silicon monoxide layer 94. Again, it should be emphasized that each of these three layers has a width determined by opening 110 of mask 60. However, the metal layers 88 and 90 are deposited according to good vacuum deposition techniques and insulating layer 94 is deposited under conditions which enhance the shadowing effect of the pattern mask.

Continuing, STEP V of FIG. 3A indicates the combination of masks necessary to deposit insulating layer 96. Again, it is seen that mask 50, having an opening 118 therein, in combination with mask 60 defines an opening of width W and a length as determined by the length of opening 118. Silicon monoxide is now deposited through this combination of masks to provide layer 96. The final step, STEP VI, illustrated in FIG. 3A is the deposition of the second control conductor 92. In this step, no auxiliary mask is necessary since opening 110 is selected to have the proper length. Alternatively, of course, the length of opening 110 could be increased over that defined by control 92 and auxiliary mask then be chosen and positioned adjacent main mask 60, this mask again having an opening greater in width than W and the necessary length as determined by control 92. Referring to STEP VI of FIG. 3B, it is seen that each of the metallic layers have essentially the same width and are in precise vertical alignment one to another and further are completely insulated by layers 94 and 96.

Again, note should be made of the fact that during each evaporation step of the method, mask 60 is rigidly positioned with respect to substrate 38 so that the problems of positioning a number of individual masks in sequence and in proper registration to obtain precisely aligned superimposed layers has been completely eliminated. Although electromagnetic means have been illustrated in the apparatus of FIG. 1A to maintain main mask 60 adjacent substrate 38, it is apparent that any desired positioning means can be employed provided that movement between substrate 38 and mask 60 during the evaporation operation is eliminated. Further, although the method has been described with reference to the fabrication of only a single cryotron, the method is further applicable to the simultaneous vacuum deposition of a plurality of in-line cryotrons to form a complex electrical circuit. In this example, the main mask includes a plurality of openings, and, as in the example described in detail above, the necessary auxiliary masks are selectively positioned as required for the gate, controls, and insulating layers of the cryotrons. At the conclusion of the fabrication of the cryotrons, the main mask is removed, and selected other masks are thereafter employed to form the necessary uncritical interconnection lines. Again, the main mask briefly described in the foregoing example may also include additional opening to determine the geometry of devices other than in-line cryotrons, and these additional openings may likewise be modified by one or more auxiliary masks.

Further note should be made of the fact that the method of the invention has been described in detail with reference only to in-line cryotrons, but it should be obvious that any multilayer solid state device, which is fabricated by vacuum evaporation techniques, can also advantageously employ the method of the invention, such as, by way of example, complex semiconductor circuitry and to obtain the precise registration is necessary for the fine juxtaposed lines or strips, as well as superimposed layers of different materials, required in making ray sensitive targets for cathode ray color television tubes.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In the method of fabricating multilayer thin film electrical circuits by the vapor deposition onto a substrate of selected materials within a vacuum chamber, said circuits including a plurality of superimposed regions of equal width and each of different predetermined length, the improvement comprising providing a first pattern defining mask having an aperture of width equal to the width of said regions and of length greater than the length of any of said regions and a plurality of auxiliary pattern defining masks each having an aperture of length equal to that of a corresponding one of said regions and width greater than the width of said regions; and thereafter thermally evaporating so as to deposit each of said materials successively through different combinations of said first mask with a predetermined one of said auxiliary masks onto said substrate to define the width of each of said regions only by said first mask and the length of each of said regions only by the corresponding one of said auxiliary masks.

2. A method of forming multilayer thin film electrical circuits by successively depositing in vacuum the necessary circuit materials, both conductive and insulating, upon a substrate in predetermined geometric patterns, all of said geometric patterns having at least one uncommon dimension and at least one common dimension, comprising the steps of:

(a) positioning a main pattern mask adjacent said substrate, said main mask being effective to define said one common dimension of said geometric patterns; and (b) thereafter, during successive depositions of said materials, positioning one of a plurality of auxiliary pattern masks in series with said main mask, each of said auxiliary pattern masks defining said uncommon dimension of a corresponding one of said geometric patterns and said main mask defining said common dimension of each of said geometric patterns.

3. A method of fabricating an in-line cryotron by the thermal evaporation of selected materials to deposit onto a substrate within an evacuated chamber, said cryotron including a gate conductor and at least one control conductor of equal width and of different predetermined lengths and insulated one from the other in precise vertical alignment, which method comprises the steps of:

(a) positioning said substrate within said chamber in spaced relationship with a plurality of evaporation source structures containing material to be evaporated;

(b) positioning a main pattern mask adjacent said substrate, said main mask including an aperture therein having a width equal to said width and a length greater than said predetermined lengths of said gate and said at least one control conductor;

(c) providing a plurality of auxiliary pattern masks selectively positionable intermediate said sources and said main masks, said auxiliary masks each including an aperture having widths greater than the width of said aperture in said main mask and lengths equal to said predetermined lengths of said gate conductor and said at least one control conductor, respectively;

(d) evacuating said chamber; and (e) evaporating each of said materials in a predetermined sequence to deposit onto said substrate through said main mask and one of said auxiliary masks in combination without relative motion between said main mask and said substrate whereby the width of said gate conductor and said at least one control conductor is determined solely by the width of said aperture in said main mask.

4. A method of fabricating an in-line cryotron, said cryotron including a gate conductor of a first material, a control conductor of a second material, said gate and control conductors insulated by a third material, each of said gate and control conductors being of equal width and of different lengths and extending longitudinally in the same direction, which method comprises the steps of:

(a) positioning said substrate within a vacuum chamber in spaced relationship to a number of evaporation source structures;

(b) placing each of said first, second, and third materials one in each of said source structures;

(c) evacuating said chamber;

(d) positioning a main pattern mask adjacent said substrate, said main mask including an opening therein having a width equal to the width of said gate and control conductors and a length equal to the length of said control conductor;

(e) positioning a first auxiliary pattern defining mask intermediate said source structures and said main mask, said first auxiliary mask including an opening therein having a width greater than the width of said gate and control conductors and a length equal to the length of said gate conductor;

(f) thermally evaporating said first material to deposit onto said substrate through said first auxiliary mask and said main mask in combination to form said gate conductor;

(g) removing said first auxiliary mask;

(h) positioning a second auxiliary pattern defining mask intermediate said source structures and said main mask, said second auxiliary mask including an opening therein having a width greater than the width of said gate and control conductors and a length greater than the length of said gate conductor but less than the length of said control conductor;

(i) thermally evaporating said third material to deposit onto said substrate through said second auxiliary mask and said main mask in combination to form said insulation;

(j) removing said second auxiliary mask; and (k) thermally evaporating said second material to deposit onto said substrate through said main mask only to form said control conductor.

5. A method of fabricating an in-line cryotron, said cryotron including a gate conductor of a first material, a control conductor of a second material, said gate and control conductors insulated by a third material, each of said gate and control conductors being of equal width and of different lengths and extending longitudinally in the same direction, which method comprises the steps of:

(a) positioning said substrate within a vacuum chamber in spaced relationship to a number of evaporation source structures;

(b) placing each of said first, second, and third materials one in each of said source structures;

(c) evacuating said chamber to a first predetermined pressure;

(d) positioning a main pattern defining mask adjacent said substrate, said main mask including an opening therein having a width equal to the width of said gate and control conductors and a length equal to the length of said control conductor;

(e) positioning a first auxiliary pattern defining mask intermediate said source structures and said main mask, said first auxiliary mask including an opening therein having a width greater than the width of said gate and control conductors and a length equal to the length of said gate conductor;

(f) thermally evaporating said first material to deposit onto said substrate through said first auxiliary mask and said main mask in combination to form said gate conductor;

(g) increasing the pressure within said chamber to a second predetermined pressure;

(h) removing said first auxiliary mask;

(i) positioning a second auxiliary pattern defining mask intermediate said source structures and said main mask, said second auxiliary mask including an opening therein having a width greater than the width of said gate and control conductors and a length greater than the length of said gate conductor but less than the length of said control conductor;

(j) thermally evaporating said third material to deposit onto said substrate through said second auxiliary mask and said main mask in combination to form said insulation;

(k) lowering the pressure within said chamber to said first predetermined pressure;

(l) removing said second auxiliary mask; and (m) thermally evaporating said second material to deposit onto said substrate through said main mask only to form said control conductor.

6. The method of fabricating an in-line cryotron by means of thermally evaporating the materials of said cryotron within an evacuated chamber so as to deposit onto a substrate comprising providing a first pattern mask which determines the width of the gate, control, and insulating segments of said cryotron; providing a further group of pattern masks which determine the length of each of said gate, control and insulating segments of said cryotron, said gate, said control and said insulating segments being of different lengths; and thereafter thermally evaporating each of said materials through a different combination of said first mask with a particular one of said further group of masks to successively form each of said segments while rigidly maintaining the position of said first mask with respect to said substrate.

7. A method of forming multilayer thin film electrical circuits by successively depositing in vacuum the necessary circuit materials, both conductive and insulating, upon a substrate in predetermined geometric patterns, all of said geometric patterns having at least one uncommon dimension and at least one common dimension, comprising the steps of:

(a) positioning a main pattern mask adjacent said substrate, said main mask being effective to define said one common dimension of said geometric patterns;

(b) thereafter, during successive depositions of said materials, positioning one of a plurality of auxiliary pattern masks in series with said main mask, each of said auxiliary pattern masks defining said uncommon dimension of a corresponding one of said geometric patterns and said main pattern mask defining said common dimension of each of said geometric patterns; and (c) depositing said insulating materials at pressures greater than the pressures maintained during the deposition of said conductive materials.

8. A method of forming multilayer thin film electrical circuits by successively evaporating in vacuum the necessary circuit materials, both conductive and insulating, to deposit upon a substrate in predetermined geometric patterns, all of said geometric patterns having at least one uncommon dimension and at least one common dimension, comprising the steps of:

(a) positioning a main pattern mask adjacent said substrate, said main mask being effective to define said one common dimension of said geometric patterns;

(b) thereafter, during successive depositions of said materials, positioning one of a plurality of auxiliary pattern masks in series with said main mask, each of said auxiliary pattern masks defining said uncommon dimension of a corresponding one of said geometric patterns and said main pattern mask defining said common dimension of each of said geometric patterns; and (c) evaporating said insulating materials to diverge throughout a volume greater than said conductive materials when evaporated.

References Cited by the Examiner

UNITED STATES PATENTS

| | | | |
|---|---|---|---|
| 2,745,773 | 5/1956 | Weimer | 117—212 |
| 2,879,188 | 3/1959 | Strull | 117—212 |
| 2,966,647 | 12/1960 | Lehtz | 338—32 |
| 2,970,896 | 2/1961 | Cornelison et al. | 117—212 |
| 3,023,727 | 3/1962 | Theodoseau et al. | 117—107.1 |

FOREIGN PATENTS

| | | |
|---|---|---|
| 867,559 | 5/1961 | Great Britain. |

OTHER REFERENCES

Holland: "Vacuum Deposition of Thin Films," 1956, John Wiley and Sons, N.Y., pp. 4–7, 449, 450, 484, and 487 relied on.

Ross: "Vakuum-Technik" 8 Jahrgang February 1959, Heft 1, pp. 1–11, (page 5 relied on).

Slade: "Thin Film Cryotrons" Proceedings of the IRE, vol. 48, No. 9, September 1960, pp. 1569–1576, page 1569 relied on.

RICHARD D. NEVIUS, *Primary Examiner.*